United States Patent
Platow et al.

(10) Patent No.: US 8,003,959 B2
(45) Date of Patent: Aug. 23, 2011

(54) ION SOURCE CLEANING END POINT DETECTION

(75) Inventors: Wilhelm P. Platow, Somerville, MA (US); Neil J. Bassom, Hamilton, MA (US); Peter F. Kurunczi, Cambridge, MA (US); Alexander S. Perel, Danvers, MA (US); Craig R. Chaney, Lanesville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 315 days.

(21) Appl. No.: 12/492,894

(22) Filed: Jun. 26, 2009

(65) Prior Publication Data
US 2010/0327159 A1   Dec. 30, 2010

(51) Int. Cl.
*H01J 37/317* (2006.01)
*H01J 37/08* (2006.01)
*H01J 49/10* (2006.01)
*H01J 27/02* (2006.01)
*H01J 9/38* (2006.01)

(52) U.S. Cl. ............... 250/492.21; 134/1.1; 134/22.1
(58) Field of Classification Search .................. None
See application file for complete search history.

(56) References Cited

U.S. PATENT DOCUMENTS

| 6,135,128 | A  | * | 10/2000 | Graf et al. ........... 134/1.1 |
| 7,819,981 | B2 | * | 10/2010 | DiMeo et al. ......... 134/1.2 |
| 2007/0045570 | A1 |  | 3/2007 | Chaney et al. |
| 2007/0108395 | A1 |  | 5/2007 | Horsky et al. |
| 2010/0154835 | A1 | * | 6/2010 | Dimeo et al. ......... 134/31 |

* cited by examiner

*Primary Examiner* — Jack Berman

(57) ABSTRACT

In an ion implanter, a Faraday cup is utilized to receive an ion beam generated during ion source cleaning. The detected beam has an associated mass spectrum which indicates when the ion source cleaning process is complete. The mass spectrum results in a signal composed of a cleaning agent and the material comprising the ion source. This signal will rise over time as the ion source chamber is being cleaned and will level-off and remain constant once the deposits are etched away from the source chamber, thereby utilizing existing implant tools to determine endpoint detection during ion source cleaning.

11 Claims, 5 Drawing Sheets

ION SOURCE CLEANING END POINT DETECTION

BACKGROUND OF THE INVENTION

1. Field of the Invention

Embodiments of the invention relate to the field of semiconductor device fabrication. More particularly, the present invention relates to an apparatus and method for cleaning an ion source chamber used in ion implantation equipment.

2. Discussion of Related Art

Ion implantation is a process used to dope impurity ions into a semiconductor substrate to obtain desired device characteristics. An ion beam is directed from an ion source chamber toward a substrate. The depth of implantation into the substrate is based on the ion implant energy and the mass of the ions generated in the source chamber. FIG. 1 is a block diagram of an ion implanter 100 including an ion source chamber 102. A power supply 101 supplies the required energy to source 102 which is configured to generate ions of a particular species. The generated ions are extracted from the source through a series of electrodes 104 and formed into a beam 95 which passes through a mass analyzer magnet 106. The mass analyzer is configured with a particular magnetic field such that only the ions with a desired mass-to-charge ratio are able to travel through the analyzer for maximum transmission through the mass resolving slit 107. Ions of the desired species pass from mass slit 107 through deceleration stage 108 to corrector magnet 110. Corrector magnet 110 is energized to deflect ion beamlets in accordance with the strength and direction of the applied magnetic field to provide a ribbon beam targeted toward a work piece or substrate positioned on support (e.g. platen) 114. In some embodiments, a second deceleration stage 112 may be disposed between corrector magnet 110 and support 114. The ions lose energy when they collide with electrons and nuclei in the substrate and come to rest at a desired depth within the substrate based on the acceleration energy.

The ion source chamber 102 typically includes a heated filament which ionizes a feed gas introduced into the chamber to form charged ions and electrons (plasma). The heating element may be, for example, a Bernas source filament, an indirectly heated cathode (IHC) assembly or other thermal electron source. Different feed gases are supplied to the ion source chamber to obtain ion beams having particular dopant characteristics. For example, the introduction of $H_2$, $BF_3$ and $AsH_3$ at relatively high chamber temperatures are broken down into mono-atoms having high implant energies. High implant energies are usually associated with values greater than 20 keV. For low-energy ion implantation, heavier charged molecules such as decaborane, carborane, etc., are introduced into the source chamber at a lower chamber temperature which preserves the molecular structure of the ionized molecules having lower implant energies. Low implant energies typically have values below 20 keV. When a particular feed gas is supplied to source chamber 102 to produce a desired ion species, additional unwanted species, either ions or neutrals, may also be produced. These unwanted species typically have low vapor pressure and may condense and adhere to the interior surfaces of the source chamber. For example, when phosphine ($PH_3$) is fed into the source chamber, phosphorous (P) deposits may form on the chamber walls. When heavy molecules such as decaborane and carborane are fed into the source chamber, unwanted deposits on the source chamber walls and electrodes is more prevalent. These solid deposits may change the electrical characteristics (voltage instability) of the chamber walls and possibly interfere with the ion source aperture from which the ions are extracted, thereby causing unstable source operation and non-uniform beam extraction.

One method used to clean the ion source chamber includes the introduction of a cleaning gas such as, for example nitrogen triflouride ($NF_3$), dichlorine ($Cl_2$), sulfur hexaflouride ($SF_6$), etc., which etches away the unwanted deposited material via plasma-enhanced chemical reaction. These gases are supplied to the ion source chamber at typically high flow rates. However, once the cleaning process begins a determination must be made when to stop the supply of cleaning gas to the source chamber. Currently, this endpoint determination requires equipment in addition to the ion implanter. For example, a Residual Gas Analyzer (RGA) or Optical Emission Spectroscopy may be employed for endpoint detection of source chamber cleaning. An RGA includes an ionizer, a mass analyzer and an ion detector. The RGA analyzes the neutrals outside the beam line and outputs a spectrum that shows the relative intensities of the various species present in the gas. The ions from the gas are distinguished by their masses by the analyzer of the RGA. Once the RGA determines that the species present in the gas corresponds to the material which comprises the ion source chamber the cleaning process is stopped. However, using RGAs for endpoint detection requires an additional piece of equipment other than the implanter itself. In addition, RGAs do not detect the ions created in and extracted from the ion source, but detect neutral gas atoms and molecules originating from all regions in the vacuum system. Thus, there is a need for endpoint detection of an ion source cleaning process utilizing existing equipment tools.

SUMMARY OF THE INVENTION

Exemplary embodiments of the present invention are directed to an apparatus and method for end point detection of ion source cleaning. In an exemplary embodiment, an ion implantation system comprises an ion source chamber defined by interior walls of electrically conductive material. The chamber generates ions in response to an introduction of a cleaning gas. The chamber includes an aperture through which the ions are extracted. A mass analyzing magnet is disposed downstream from the ion source chamber. The mass analyzer magnet is configured to select ions from the ion beam having a particular mass-to-charge ratio. A Faraday cup is disposed downstream of the mass analyzing magnet and is configured to receive the ion beam. A current meter coupled to the Faraday cup is configured to provide a signal representative of the ions received by the Faraday cup. The signal represents ions associated with the electrically conductive material of the ion source chamber and the cleaning gas.

In an exemplary method, a cleaning gas is introduced into an ion source chamber over a given period. The ion source chamber has interior walls composed of an electrically conductive material. The gas is ionized within the ion source chamber and extracted into an ion beam. The mass spectrum of the ions of the ion beam are detected and when the mass spectrum indicates that the electrically conductive material of the ion source chamber is present in the ion beam at a relatively constant rate over said given period, the cleaning process is stopped.

DESCRIPTION OF EMBODIMENTS

Figure 1:
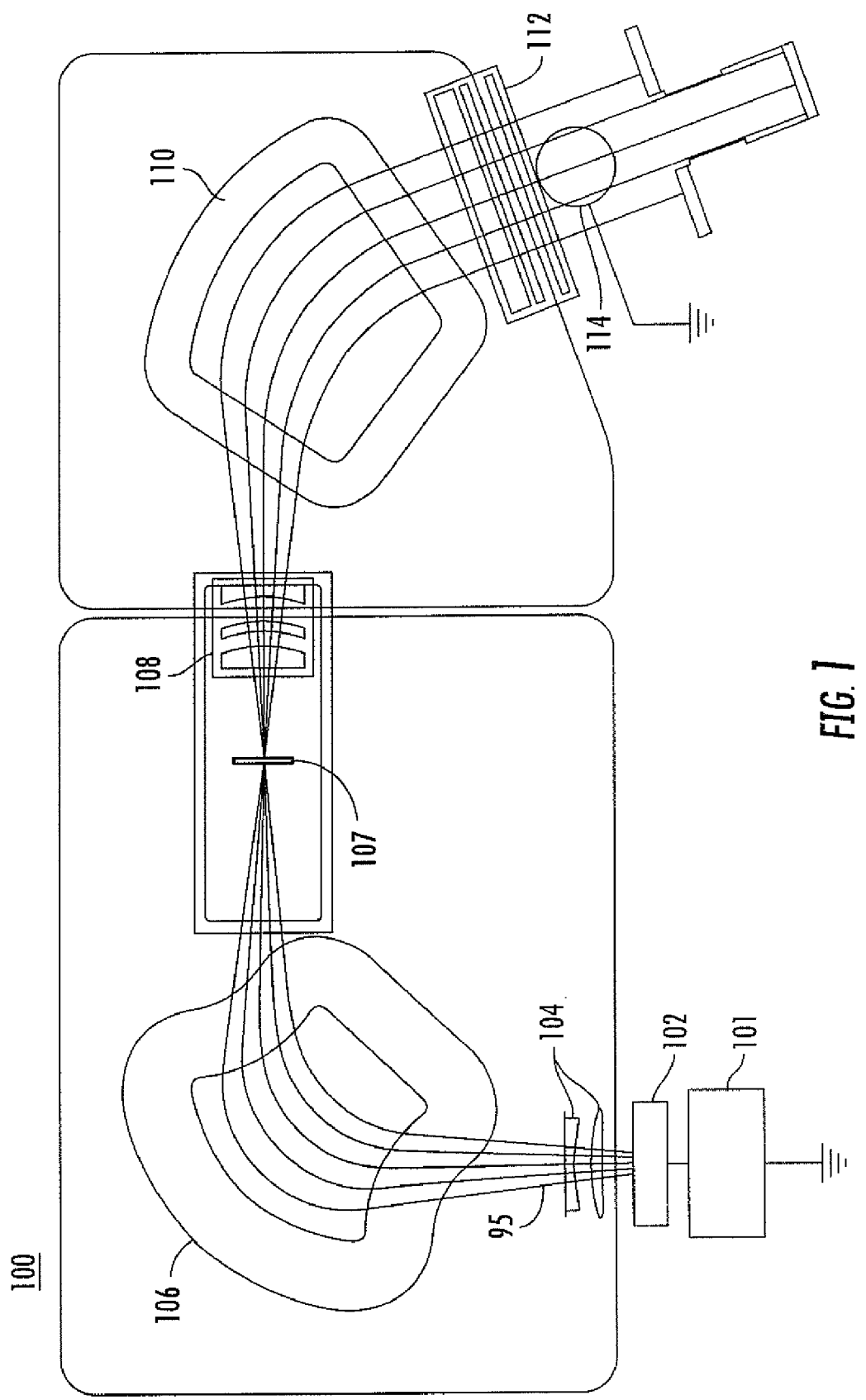
FIG. 1 illustrates a block diagram of a representative ion implanter.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2:
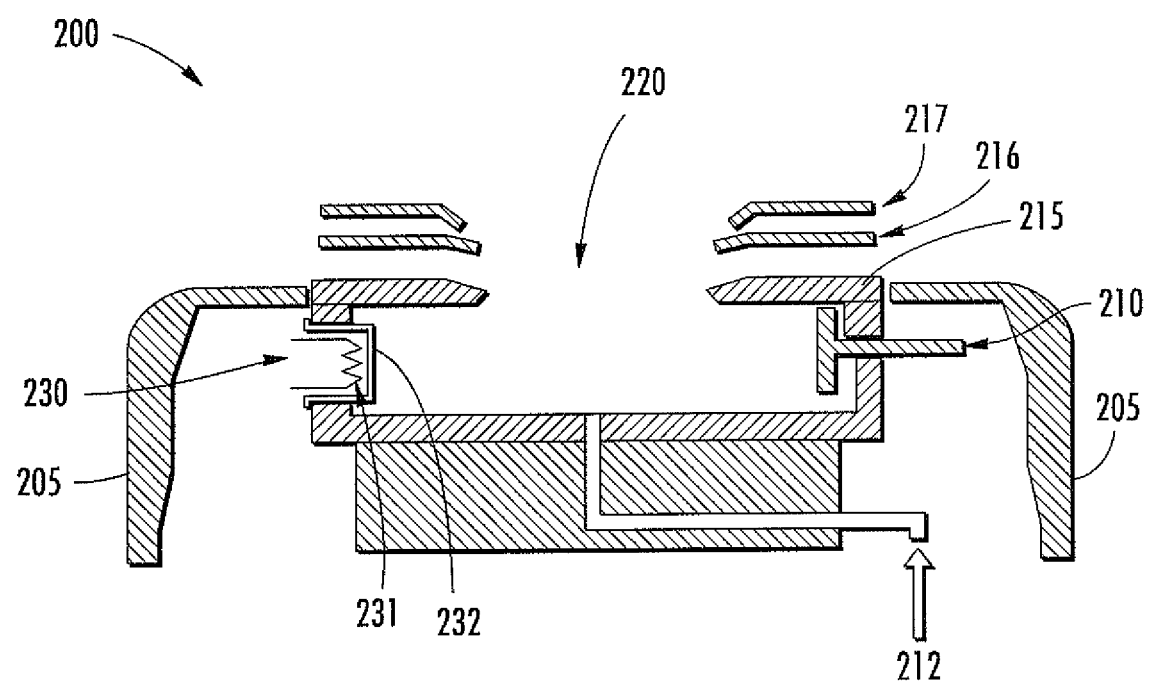
FIG. 2 is a cross sectional block diagram of an ion source in accordance with an embodiment of the present invention.

FIG. 2 is a cross sectional block diagram generally illustrating an ion source chamber 200 used to generate ions for implantation into a substrate. Chamber 200 includes aperture 220 through which ions are extracted. The interior walls of chamber 200 are electrically conductive (e.g. tungsten) and define an ionization zone within which energy is imparted to a dopant gas having source elements such as, for example, phosphorous (P) and arsenic (As) to generate associated ions. The ions formed from the dopant gas are extracted from source chamber 200 via aperture 220 by way of a standard three (3) electrode configuration comprising plasma electrode 215, suppression electrode 216 and ground electrode 217 used to create an electric field. Although suppression electrode 216 is shown as being spaced apart from ground electrode 217, this is for illustrative purposes only and the electrodes are physically in contact with each other via insulators. Plasma electrode 215 may be biased at the same large potential as ion source chamber 200. Suppression electrode 216 is connected to a power supply and is typically biased at a moderate negative value to prevent electrons from entering back into source chamber 200. Ground electrode 217 is positioned downstream from suppression electrode 216 and is at ground potential. The strength of the electric field generated by the electrodes can be tuned to a desired beam current to extract a particular type of ion beam from the ions generated in chamber 200.

Ion source chamber 200 is an indirectly heated cathode chamber which includes a cathode/filament assembly 230 located at one end of the ion source chamber 200. A filament 231 is positioned in close proximity to cathode 232 outside the ion chamber. A voltage is supplied to filament 231 which produces enough current through the filament to heat it and produce thermo-electrons. Cathode 232 is indirectly heated via filament 231 by biasing the cathode more positively than the filament which causes these thermo-electrons to accelerate from filament 231 toward cathode 232, thereby heating the cathode. Cathode 232 emits thermo-electrons into the ion source chamber 200 which ionizes a dopant gas introduced into the chamber forming plasma. A repeller 210 is typically positioned on the opposite end of the ion source chamber 200 and is biased to the same voltage as cathode 232. The emitted electrons are confined between the cathode 232 and repeller 210 which collide with the dopant feed gas to generate the plasma having the desired properties.

As noted above, when a feed gas is supplied to the ion source chamber to produce a desired ion species, additional unwanted species may also be produced which deposit on the interior walls of chamber 200. During normal (non-cleaning cycle) ion source operation, conduit 212 is used to introduce dopant gas into the source chamber 200. During cleaning operation, conduit 212 is used to introduce cleaning gas into chamber 200 as indicated by arrow 212. For example, reactive cleaning gases such as nitrogen triflouride ($NF_3$) or dichlorine ($Cl_2$) may be supplied into the chamber 200 via conduit 212 at relatively high flow rates (e.g. 100 sccm or higher). Introduction of these cleaning gases is performed in situ and may be introduced simultaneously with the dopant species or as a separate cleaning plasma during equipment down time and/or between specie changes. For example, when $NF_3$ is introduced into chamber 200, atomic fluorine is generated by the disassociation of $NF_3$ into the nitrogen-containing and fluorine-containing molecules and atoms. These fluorine containing cleaning gases undergo chemical reactions inside the source chamber 200 via plasma and/or thermal chemistries thereby generating highly-reactive meta-stable species of fluorine. These specie etch the deposits formed on the walls of chamber 200. In this manner, plasma is used to remove the deposits on the interior of chamber 200. Once removed, the deposits are converted into gaseous or volatile compounds and extracted from chamber 200 by plasma electrode 215, suppression electrode 216 and ground electrode 217.

Figure 3:
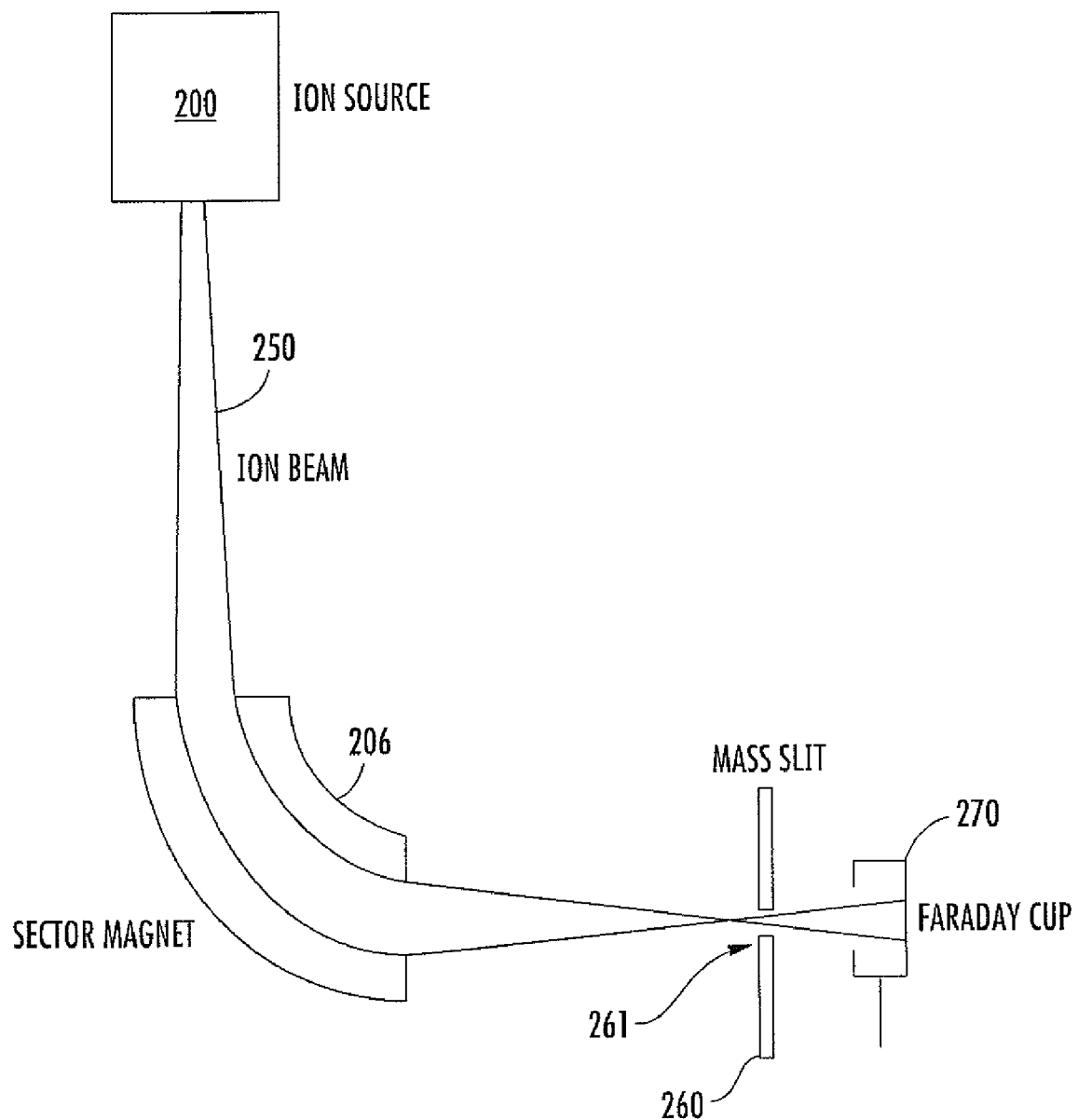
FIG. 3 is a block diagram of an exemplary simplified portion of an ion implanter in accordance with an embodiment of the present invention.

FIG. 3 illustrates a simplified block diagram of a first portion of an ion implanter shown in FIG. 1. In particular, the portion of ion implanter 300 includes an ion source 200 (extraction electrodes are omitted), mass analyzer magnet 206, mass resolving slit 260 and Faraday cup 270. Downstream components such as, for example, deceleration stage (s), corrector magnet and workpiece platen are omitted for ease of explanation. As described above, cleaning gas is introduced into source chamber 200, ionized and extracted by way of extraction electrodes to supply beam 250 toward mass analyzer magnet 206. The analyzer magnet is used to select the desired ion species as the ions travel through the magnetic field for transmission through the mass resolving slit 260 having aperture 261. A Faraday cup 270 is positioned downstream of the mass resolving slit 260 in order to capture the entire beam before it travels to the corrector magnet and/or downstream acceleration/deceleration stages. The Faraday cup is used to measure the current of analyzed beam 250. In this configuration, the Faraday cup 270 receives analyzed beam 250 and produces an electrical current based on the representative current of beam 250. Faraday cup 270 is connected to a current meter to detect the amperage (e.g. mA) and based on the area of the aperture 261 of mass resolving slit 260 determines the current (e.g. mA/cm2) of the ion beam received by Faraday cup 270.

Figure 4A:
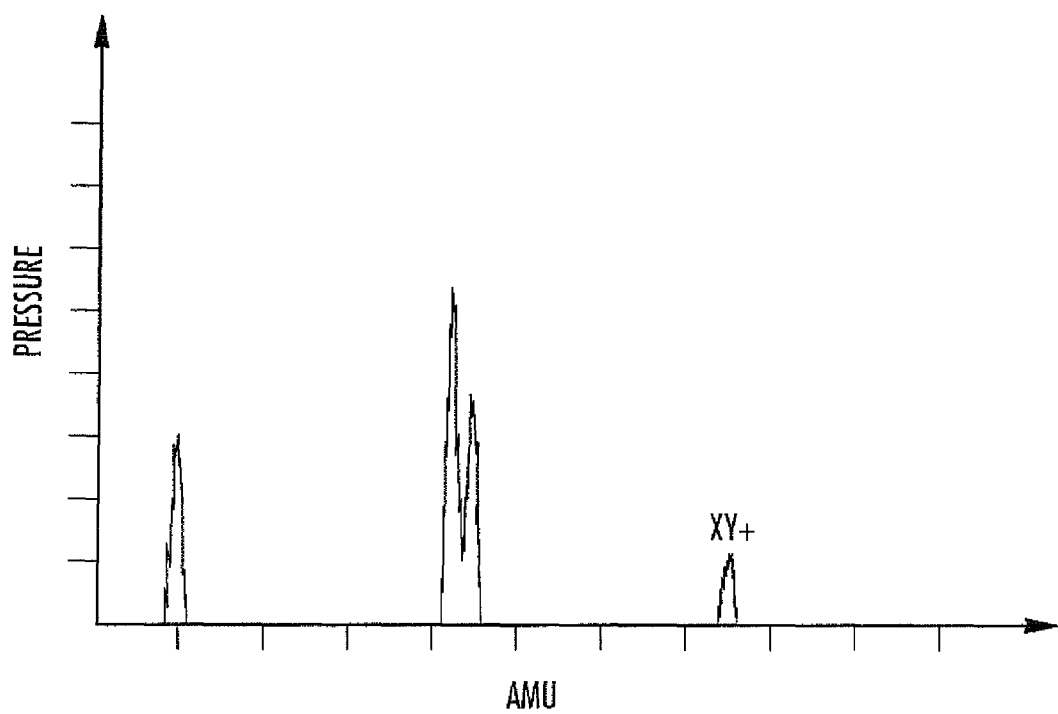
FIG. 4A is an exemplary mass spectrum of signal from the ion source shown in FIGS. 2 and 3 in accordance with an embodiment of the present invention.
Figure 4B:
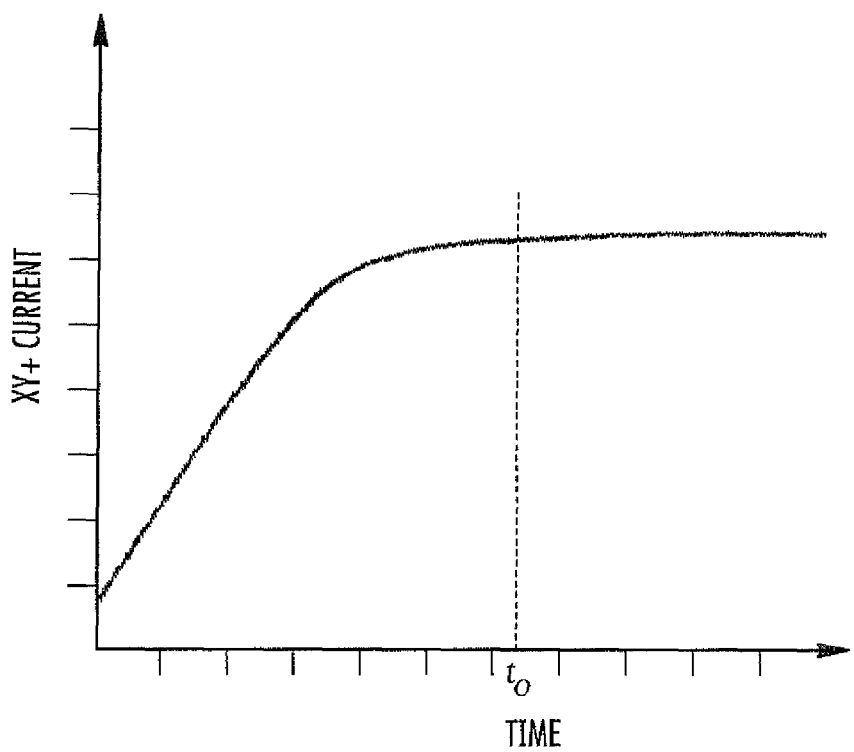
FIG. 4B is an exemplary graph of the spectrum of the XY+ signal over time in accordance with an embodiment of the present invention.

During the cleaning of source chamber 200, deposits on the interior walls of the chamber are removed via the extracted ion beam. Mass analyzer magnet 206 can be set to the mass of the ions generated from the cleaning process to sweep the desired beam to mass slit 261 which is received by Faraday cup 270. In particular, the extracted ion beam has a particular mass spectrum signal composed of the cleaning gas and the material which makes up the interior surface of chamber 200 (e.g. tungsten). FIG. 4A is an example of a mass spectrum for an ion beam extracted from ion source chamber 200 when a cleaning gas is introduced into the chamber and detected by way of Faraday cup 270. The mass spectrum of the received ion beam at a particular pressure will have a signal portion denoted as XY+ which is generated due to the reaction of the material that comprises the interior of chamber 200 and the cleaning gas. For example, if chamber 200 is made from tungsten and the cleaning agent is $Cl_2$, then the mass spectrum of the ion beam signal (denoted as XY+) received by Faraday cup 270 comprises chlorine and tungsten. At the beginning of the cleaning process, the level of tungsten would be relatively low since the cleaning agent is removing the material deposited within the chamber 200. As the cleaning process continues, the areas of chamber 200 covered by these deposits gets smaller and the amount of tungsten which is present in the ion beam as illustrated by the mass spectrum analysis increases. This is illustrated in FIG. 4B where the XY+ component of the signal that includes the cleaning gas and the source chamber material increases at the start of the cleaning process since more deposits are being removed from the chamber 200, but then levels off at time $t_0$ which indicates that more of the chamber material is being detected in the XY+ signal. Since the detected chamber material is being constant, that means that there are no more deposits left to be removed and the chamber is clean. Alternatively, only the amount of the cleaning agent (e.g. chlorine) in the XY+ signal may be detected. In this case, the level of cleaning agent will be high in the beginning of the cleaning process and dropping to near zero at time $t_0$ to indicate that the chamber is clean. Although an exemplary mass spectrum of the ion beam signal (XY+) comprises chlorine and tungsten, the system can be configured to measure just the tungsten portion or other material which makes up the interior of the surface of chamber 200. By detecting the presence of ions associated with the chamber material (and/or the cleaning agent) via Faraday cup 270, cleaning times and conditions can be controlled using a mass spectrum analysis. In this manner, an endpoint detection process may be used to determine when an ion source chamber is cleaned through the use of the implanter tool and without the need for additional equipment.

Figure 5:
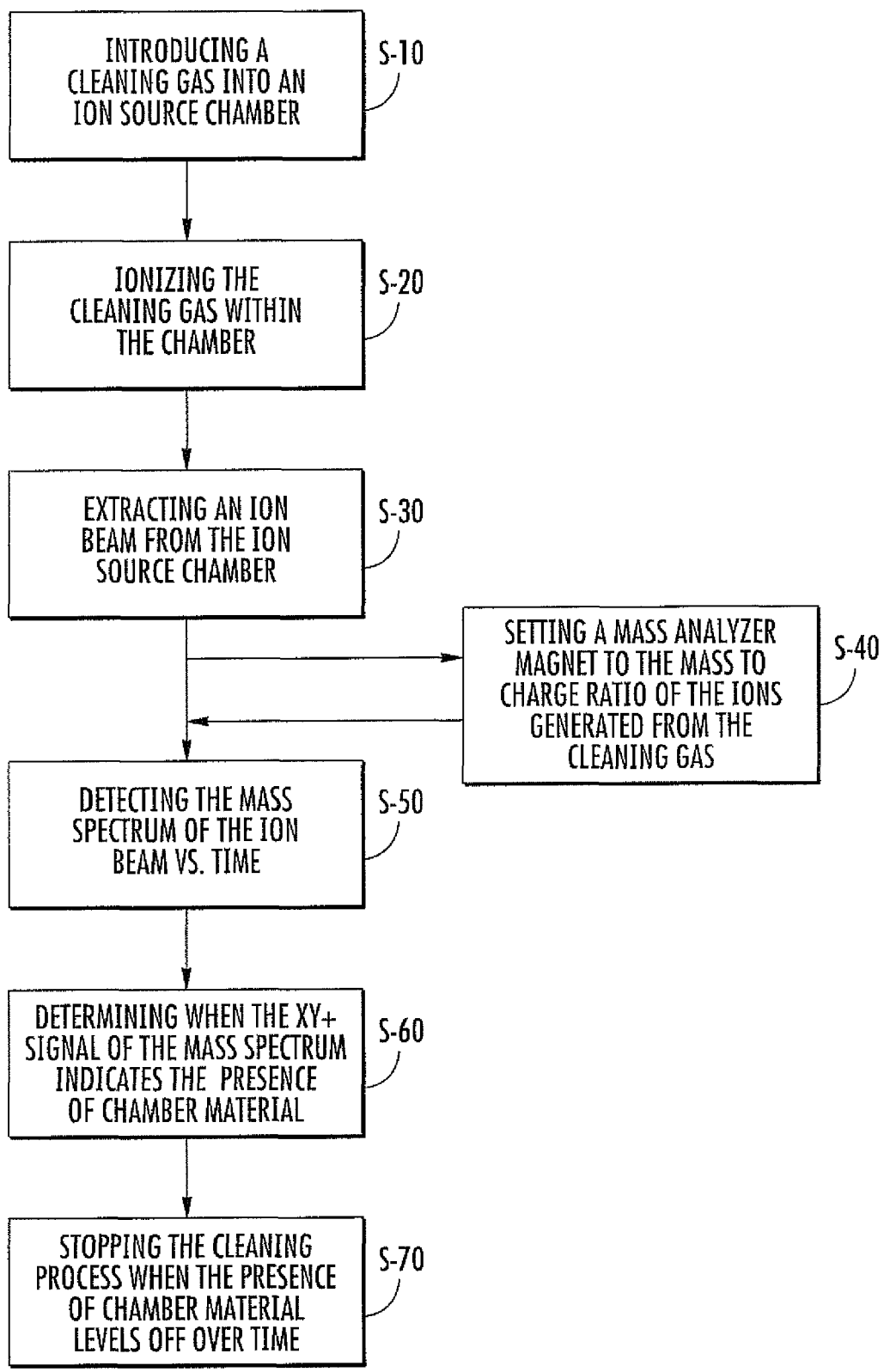
FIG. 5 is a flow chart illustrating a process of cleaning an ion source chamber.

FIG. 5 is a flow chart illustrating a process of cleaning an ion source chamber of an ion implanter utilizing a mass spectrum analysis to determine endpoint determination. A cleaning gas such as nitrogen triflouride ($NF_3$), dichlorine ($Cl_2$), sulfur hexaflouride ($SF_6$), etc., is introduced into the ion source chamber 200 via conduit 212 at step S-10. The cleaning gas is ionized within the chamber by providing the gas at an appropriate temperature and flow rate at step S-20. As the cleaning gas is being ionized and/or broken into highly-reactive etchant atoms within the source chamber, an ion beam is extracted from the source chamber at step S-30. At step S-40, the mass analyzer magnet of the ion implant tool is set to the mass to charge ratio of the ions generated from the cleaning process. The ion beam is detected by the Faraday cup 270 at step S-50 and the mass spectrum of the ion beam having the XY+ signal is determined at step S-60. When the presence of the chamber material is detected in the mass spectrum of the ion beam and such presence levels-off over time, the chamber cleaning process is stopped at step S-70. In this manner, the endpoint of the process for cleaning an ion source chamber of an ion implanter may detected through the use of a mass spectrum analysis of a received ion beam generated from an ion source using existing in-line implant tool equipment.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A method of endpoint detection for ion source chamber cleaning comprising:
    introducing a cleaning gas into said ion source chamber over a given period, said ion source chamber having interior walls composed of an electrically conductive material;
    ionizing said gas within said ion source chamber;
    extracting the ionized gas from the ion source chamber into an ion beam;
    detecting the mass spectrum of the ions in the ion beam;
    determining when the mass spectrum of the ions in the ion beam indicates that the electrically conductive material of the ion source chamber is present in the ion beam at a relatively constant rate over said given period.

2. The method of claim 1 further comprising stopping the introduction of cleaning gas to said ion source chamber when the mass spectrum indicates said electrically conductive material is present in the ion beam at said relatively constant rate.

3. The method of claim 1 wherein detecting the mass spectrum of the ions in the ion beam includes generating a signal representative of said cleaning gas.

4. The method of claim 1 wherein detecting the mass spectrum of the ions in the ion beam includes generating a signal representative of said electrically conductive material.

5. The method of claim 1 wherein detecting the mass spectrum of the ions includes detecting said ions in the ion beam using a Faraday cup.

6. The method of claim 1 wherein the ionized gas from the ion source chamber includes deposits from the interior walls of said chamber.

7. The method of claim 4 wherein the electrically conductive material is tungsten.

8. The method of claim 4 wherein the electrically conductive material is graphite.

9. An ion implantation system comprising:
    an ion source chamber defined by interior walls of electrically conductive material, said chamber generating ions in response to a cleaning gas introduced into said chamber, said chamber having an aperture through which said ions are extracted;
    a mass analyzing magnet disposed downstream from said ion source chamber, said mass analyzer magnet configured to select ions from said ion beam having a particular mass-to-charge ratio;
    a Faraday cup disposed downstream of said mass analyzing magnet configured to receive said ion beam; and
    a current meter coupled to the Faraday cup is configured to provide a signal representative of the ions received by the Faraday cup, said signal representing ions associated with said electrically conductive material of said ion source chamber and said cleaning gas wherein said cleaning gas is not introduced into said chamber when said signal representing ions associated with said electrically conductive material is relatively constant over a given time period.

10. The ion implantation system of claim 9 wherein said cleaning gas is nitrogen triflouride ($NF_3$).

11. The ion implantation system of claim 9 wherein said cleaning gas is dichlorine ($Cl_2$).

* * * * *